United States Patent [19]
Kuwayama

[11] Patent Number: 4,932,781
[45] Date of Patent: Jun. 12, 1990

[54] GAP MEASURING APPARATUS USING INTERFERENCE FRINGES OF REFLECTED LIGHT

[75] Inventor: Tetsuro Kuwayama, Yokohama, Japan

[73] Assignee: Canon Kabushiki Kaisha, Tokyo, Japan

[21] Appl. No.: 80,209

[22] Filed: Jul. 31, 1987

Related U.S. Application Data

[63] Continuation of Ser. No. 666,682, Oct. 31, 1984, abandoned.

[30] Foreign Application Priority Data

Nov. 4, 1983 [JP] Japan .................... 58-207766
Nov. 4, 1983 [JP] Japan .................... 58-207767

[51] Int. Cl.⁵ .................................. G01B 9/02
[52] U.S. Cl. ......................... 356/357; 356/355
[58] Field of Search ............ 356/355, 356, 357, 358; 350/420

[56] References Cited

U.S. PATENT DOCUMENTS

| | | | |
|---|---|---|---|
| 2,466,322 | 4/1949 | Merritt | 356/357 |
| 2,595,923 | 8/1961 | Ubbelohde et al. | 356/357 |
| 3,402,978 | 9/1968 | Offner | 350/420 X |
| 4,072,422 | 2/1978 | Tanaka et al. | 356/355 |
| 4,105,335 | 8/1978 | Tanaka et al. | 356/355 |

FOREIGN PATENT DOCUMENTS 52-52579 4/1977 Japan .................... 356/357

*Primary Examiner*—Vincent P. McGraw
*Assistant Examiner*—S. A. Turner
*Attorney, Agent, or Firm*—Fitzpatrick, Cella, Harper & Scinto

[57] ABSTRACT

A proximity gap measuring system usable in a proximity mask aligner. The measuring system includes an illumination optical system for illuminating a mask and a wafer with white light, and an optical system, including a Wollaston prism, for dividing a wavefront of each of the light beams reflected from the mask and the wafer and causing relative inclination between the divided wavefronts to form a white light fringe on the Wollaston prism. Between the Wollaston prism and the mask or wafer, there is an anamorphic imaging system for forming an image of each of the mask and wafer on the Wollaston prism.

2 Claims, 9 Drawing Sheets

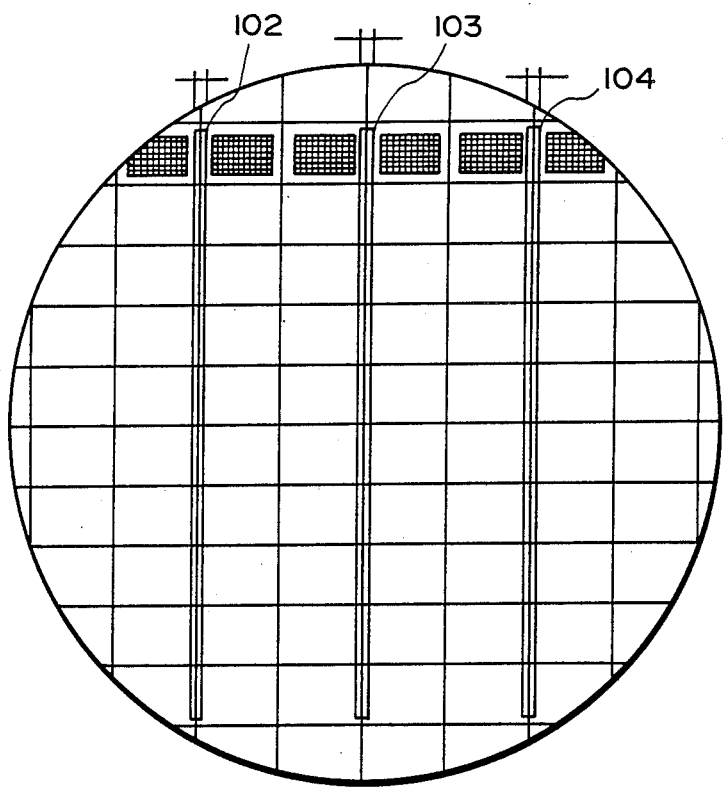
F I G. 7

GAP MEASURING APPARATUS USING INTERFERENCE FRINGES OF REFLECTED LIGHT

This application is a continuation of application Ser. No. 666,682 filed Oct. 31, 1984, now abandoned.

BACKGROUND OF THE INVENTION

This invention relates to a gap measuring system for adjusting a gap or spacing between a transparent object which is capable of reflecting a light beam at least to a degree and a transparent or non-transparent object which is capable of reflecting a light beam at least to a degree.

In X-ray exposure apparatuses or proximity exposure apparatuses using ultraviolet rays, which are examples of pattern printing apparatuses, it is necessary that the spacing between a mask and a wafer be accurately adjusted so that a predetermined minute gap is maintained therebetween, and that the mask and wafer are held in a sufficiently parallel relation.

This has been conventionally achieved by mechanical adjustment using a dummy mask. The dummy mask has a projected portion having a height corresponding to the necessary spacing or gap. During adjustment, the dummy mask is used in place of an actual or real mask and the wafer is fixedly held with its photoresist surface directly contacted to the dummy mask so that the predetermined gap is established between the wafer and the actual mask position. This mechanical adjustment is, however, disadvantageous since the photoresist surface is liable to be damaged, which leads to decreased yield of the semiconductor devices. Further, the photoresist material adhering to the surface of the dummy mask causes errors in the parallelism setting and the gap setting. These problems can be overcome if the mask and the photoresist surface of the wafer are opposed to each other without any contact and the alignment is effected while maintaining such non-contact state.

A system for adjusting the gap between the mask and wafer using a plurality of white light interferometers has already been proposed by the same assignee of the subject application in a Japanese Patent Application Laid-Open No. 52-52579. Also a white light interferometer using a Wollaston prism has already been proposed by the same assignee of the subject application in a Japanese Patent Application Laid-Open No. 52-4260.

FIG. 1 shows such white light interferometer using the Wollaston prism, and this is incorporated into the embodiments of the present invention which will be described later. In FIG. 1, designated by a reference numeral 1 is a light source such as a tungsten lamp providing a light beam 2 having a wavelength range. The light beam 2 illuminates an object 3 to be measured (e.g. a plastic film or air spacing between the mask and wafer) having an index of refraction n and a thickness d. A portion of the light beam 2 is reflected by a first surface 31 of the object 3 so that it is deflected as a light beam 5. Another portion of the light beam 2 is refracted by the first surface 31 of the object 3 and then reflected by a second surface 32 of the object 3 so that it is deflected as a light beam 4. The light beam 4 is again refracted by the first surface 31 so that it is deflected as a light beam 6. For the sake of simplicity of description, a single wave surface or wavefront 51 at one moment is selected as a representative of the light beam 5, while a single wavefront 52 at the same moment is selected as a representative of the light beam 6. As is well known in the art, the optical path length difference between the wavefront 51 and the wavefront 52 is expressed as $2 \cdot n \cdot d \cos\phi$, where $\phi$ is the angle of incidence on the second surface 32 of the object 3.

The arrangement shown in FIG. 1 includes an interference fringe forming portion 50 which is disposed to receive the wavefront 51 and the wavefront 52. The interference fringe forming portion includes a polarizer 53, a Wollaston prism 60 and an analyzer 56 which are disposed in this order along the optical axis. The Wollaston prism 60 consists of a combination of a prism 54 made of a birefringent or double refracting crystal material, such as a crystal or calcite, which has been cut so that the optic axis thereof extends in a direction perpendicular to the plane of the sheet of the drawing, with a prism 55 made of a similar birefringent crystal material which has been cut so that the optic axis thereof extends longitudinally as viewed in the drawing. The polarizer 53 is disposed so that its optic axis defines an angle of 45 degrees relative to each of the optic axes of the crystals 54 and 55. The analyzer 56 is disposed relative to the polarizer 53 so that they provide parallel or crossed Nicols.

In this arrangement, the polarizer 53 provides a linearly polarized light which vibrates in the direction having an angle of 45 degrees relative to the plane of the sheet of drawing. This linearly polarized light enters into the prism 54 whereby it is separated into ordinary rays and extraordinary rays. These ordinary rays and extraordinary rays are in turn incident on the prism 55 in which the ordinary rays advance as extraordinary rays while, on the other hand, the extraordinary rays advance as ordinary rays. Because of the difference in the refractive index of the birefringent crystal material with respect to the ordinary rays and extraordinary rays, the rays emitted from the prism define wavefronts which are inclined relative to each other. As the result, the wavefronts 51 and 52 are transformed into wavefronts 51', 51'' and wavefronts 52', 52'', respectively, which produce interference fringes having intensity distributions under action of the analyzer 56. The optical path difference between these wavefronts can be expressed as $2(n_e - n_o) \cdot Y \cdot \tan\theta$, where $n_o$ is the refractive index of the birefringent material with respect to the ordinary rays, $n_e$ is the refractive index of the birefringent material with respect to the extra-ordinary rays, Y is the co-ordinate with respect to an origin which is coincident with a point at which two prisms have the same thickness and measured in the direction orthogonal to the optical axis, and $\theta$ is the optical angle of the prism.

The wavefronts 51' and 51'' interfere with each other while the wavefronts 52' and 52'' interfere with each other, so that in the neighborhood of points 58 (Y=0) shown in FIG. 1, peaks of the white light fringes are formed respectively.

On the other hand, the wavefront 51' and the wavefront 52'' interfere with each other in the neighborhood of a point 57 shown in FIG. 1, while the wavefront 52' and the wavefront 51'' interfere with each other in the neighborhood of a point 59, so that side peaks are formed thereat, respectively. The points at which these peaks are produced are such points at which:

$$2 \cdot n \cdot d \cos\phi = 2(n_e - n_o) \cdot Y \cdot \tan\theta.$$

At each of these points, an optical path length difference of such amount which just cancels the optical path length difference caused by the object 3 is produced by the Wollaston prism P. From the above-described relation, the side peaks are formed in the neighborhood of:

$$Y = \pm n \cdot d \cdot \cos\phi / \{(n_e - n_o)\tan\theta\}.$$

These white light fringes are projected by a lens 69 onto a photodetector 30.

The white light fringes projected on the photodetector 30 are schematically illustrated in FIG. 2. In this Figure, a reference character Fc designates a center interference peak while reference characters Fs and Fs' designates side peaks, respectively. When the Wollaston prism has a given optical angle $\theta$ and the object to be measured has a refractive index, measurement of the distance between the peaks Fc and Fs or the distance between the peaks Fc and Fs' serves as a measure of the thickness of the object to be measured or the distance between the surfaces of the object to be measured, since the distance between the peaks as aforesaid is proportional to the thickness of the object to be measured or the distance between the surfaces of the object.

FIG. 3 shows an arrangement for measuring and adjusting the gap between a mask and a wafer with the use of white light interference fringes, such as disclosed in the aforementioned Japanese Patent Application Laid-Open No. 52-52579. In FIG. 3, elements corresponding to those shown in FIG. 1 are denoted by the same reference numerals. The light beam emitted from a white light source 1 is condensed by condenser lenses 23 and 24 and then is reflected by a half mirror 26 to an objective lens 27. By this objective lens 27, the light beam is collimated so that a parallel beam illuminates a mask 11 and a surface 201 of a photoresist layer 14 formed on a wafer 12. Designated by a reference numeral 25 is a color filter inserted into the path of the illumination light in order to prevent sensitization of the photoresist 14. The filter 25 may usually be a yellow filter absorbing the rays having wavelengths not greater than 500 nm. If the optical system is arranged so that the transparent portions of the mask 11 are illuminated by the illuminating light beam, the rays reflected by the mask 11 surface and the photo-resist surface 201 are converged again by the objective lens 27 and, after transmitted through the half mirror 26, are collimated by another collimator lens 27'. The combination of the visible light with the transparent portions of the mask 11 may of course be replaced by a combination of X-rays, which is invisible, with a mask therefor. This is because the mask to be used in the X-ray exposure is very thin, so that it can be considered in essence as being approximately transparent relative to the longer-wavelength region of the visible range and to the infrared range.

In the path of the advancing parallel light beam formed by the collimator lens 27', there is provided an interference fringe forming portion 50 comprising a polarizer 53, a Wollaston prism 60 and an analyzer 56. With this arrangement, white light interference fringes having information on the distance or gap between the mask and wafer with respect to the area of the photomask which is being currently illuminated are formed on the Wollaston prism 60. The image of interference fringe is projected through a projection lens 69 on a photodiode array or image pickup tube 30, and, on the other hand, is reflected by a half mirror 28 so that it is observed by an observer 14 through eyepiece lenses 31 and 32. Automatic adjustment of the gap between the mask and wafer is performed in the following manner. First, the distance between the center peak Fc and the side peak Fs detected by a photodetector 30 such as a photodiode array is compared with a reference value in a signal processing circuit 36. On the basis of the results of comparison, an actuator control circuit 37 drives one or more of actuators 35, 35' and 35" in the directions as denoted by double headed arrows shown in FIG. 3.

Subsequently, by moving the mask relative to the measuring optical system or by using a plurality of measuring optical systems, the gaps between the mask and wafer at a plurality of points are measured. The signal processing circuit 36 compares the results of measurement with the reference value. On the basis of the results of comparison, one or more of the actuator rods 35, 35' and 35" are driven in the directions as denoted by the double-headed arrows through the actuator control circuit 37, whereby a constant and predetermined distance or gap is achieved between the mask and the wafer at the plural points.

If a thin layer such as the photoresist layer 14 exists in addition to the air space, as shown in FIG. 3, the gap measurement can be achieved without any specific difficulties. This is explained with reference to FIG. 4A and 4B. The FIG. 4A shows the white light fringes in a case where an object having a thickness $d_1$ and a refractive index $n_1$ is measured. The abscissa shows the space co-ordinate while the ordinate shows the intensity of light. FIG. 4B shows the fringes in a case where a material having a thickness $d_2$ and a refractive index $n_2$ is formed on an object having a thickness $d_1$ and a refractive index $n_1$. In this case, the value of $n_2 \times d_2$ is not greater than 0.5 microns which is small as compared with the value $n_1 \times d_1$. Usually, the thickness of the photoresist used in the patterning of the semiconductor device is not greater than 0.2 microns, while the air gap used in the X-ray exposure or proximity exposure process is in a range of 5–10 microns, which is not less than 20 times larger than the thickness of the photoresist.

Thus, in this case, the form of the center peak can be regarded as being slightly expanded, such that the measurement of the air gap can be achieved without any specific inconveniences.

The above-described gap adjusting method may be satisfactory if each of the mask and the wafer has a relatively small diameter and has sufficient flatness. If, however, the diameter of the wafer is enlarged, several problems arise therefrom.

For example, when a larger diameter wafer such as a 6-inch wafer or a 7-inch wafer is to be used as compared with the conventional 3-inch wafer, it is difficult to maintain the flatness without using any specific flatness correcting means. In the X-ray exposure system, for example, an air gap of $10 \pm 1$ microns must be maintained between the entire mask and wafer. When, however, the wafer diameter is not less than 6 inches and if the wafer has been subjected to various semiconductor circuit manufacturing processes, the wafer surface will include complicated irregularities. These irregularities can not be sufficiently removed by the actuators 35, 35' and 35" only. In order to correct such irregularities to assure practically sufficient flatness, it has been proposed and actually practiced that a holder for holding the wafer by vacuum suction is divided into plural elements and a load is applied to each of the respective actuators to achieve flatness correction. This method however does not assure very satisfactory results unless the gap between the mask and wafer at multiple points on the wafer is measured substantially at the same time. Such multi-point measurement will be achieved, for example, by enlarging the optical system of the gap measuring device so that the entire surface of the wafer can be observed at the same time. However, this is inconvenient for the following reasons:

First, if the optical system shown in FIG. 3 is enlarged without any significant change thereto, the optical system becomes too bulky and weighty.

Second, the manufacturing cost thereof becomes too high.

For example, when the gap measuring optical system is arranged so that the wafer and the Wollaston prism are disposed in a one-to-one imaging relation, a 5-inch wafer requires a 5-inch crystal plate while a 7-inch wafer requires a 7-inch crystal plate.

SUMMARY OF THE INVENTION

It is accordingly a principal object of the present invention to provide a gap measuring device capable of measuring the distance or gap between two objects such as a larger diameter mask and a larger diameter wafer with the use of a small size crystal.

In a gap measuring device according to the present invention which will be described in more detail in the following part of the Specification, an anamorphic optical system is disposed between the objects and optical means, such as a Wollaston prism or the like, for dividing the wavefront and inclinating the divided wavefronts to thereby form the interference fringes. With this arrangement, the optical means can be maintained compact in size.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 7 is a plan view of a wafer showing the measurement points according to the present invention.

DESCRIPTION OF THE PREFERRED EMBODIMENTS

Figure 1:
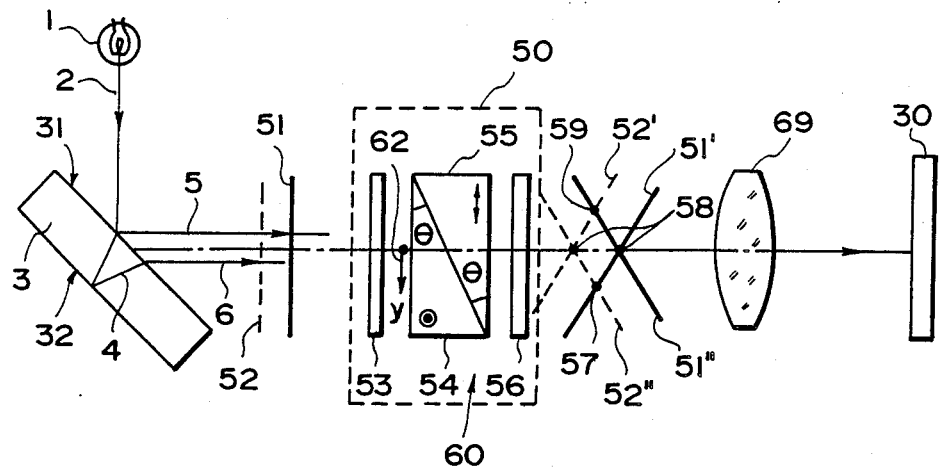
FIG. 1 is a view showing the principle of measurement of the thickness of an object with the use of a white light interferometer.
Figure 2:
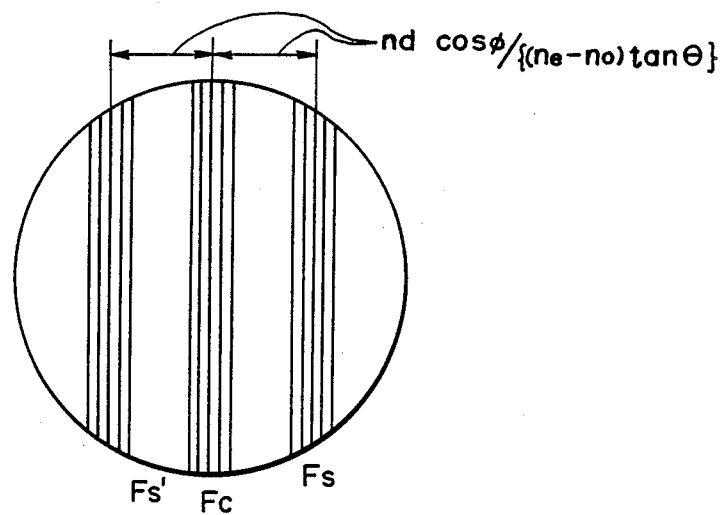
FIG. 2 is a view schematically showing the two-dimensional structure of the white light fringes.
Figure 3:
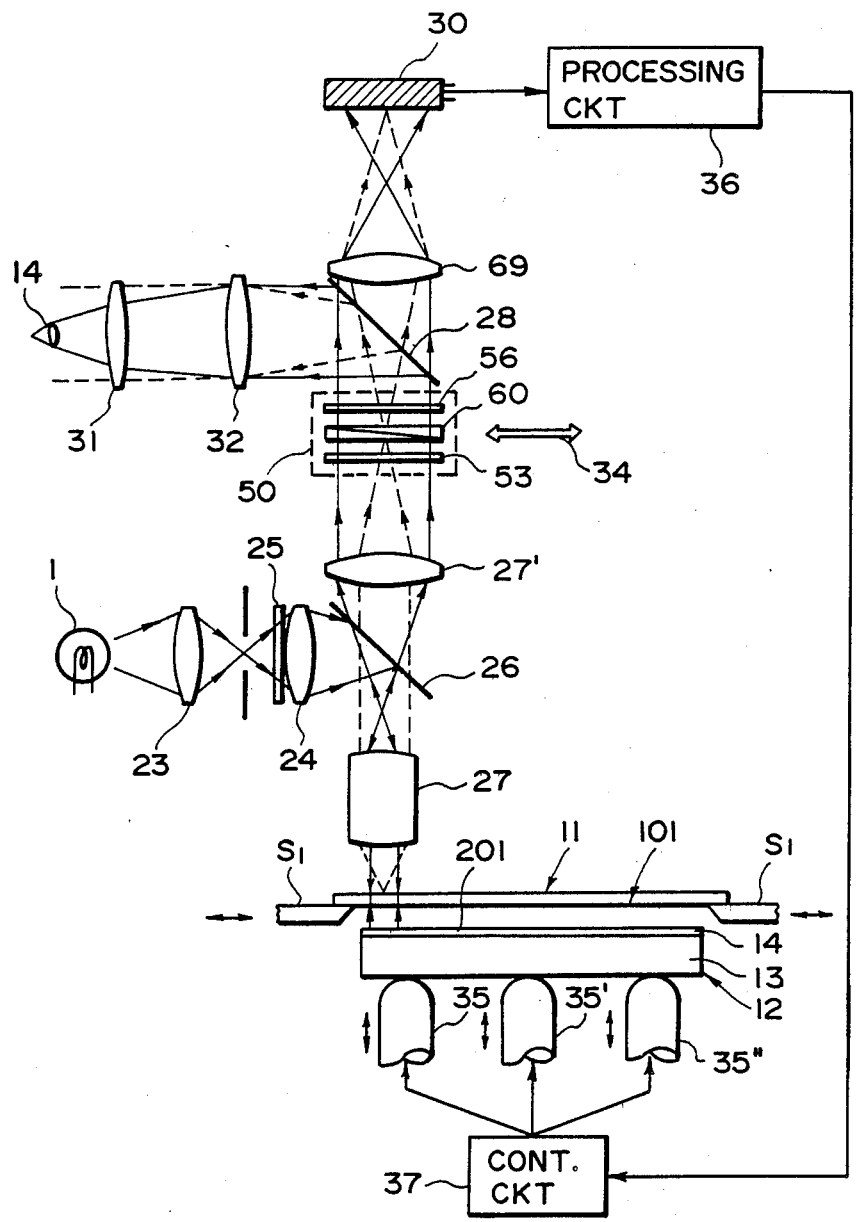
FIG. 3 is a view showing the principle of measurement of a gap between a mask and a wafer.
Figure 4A:
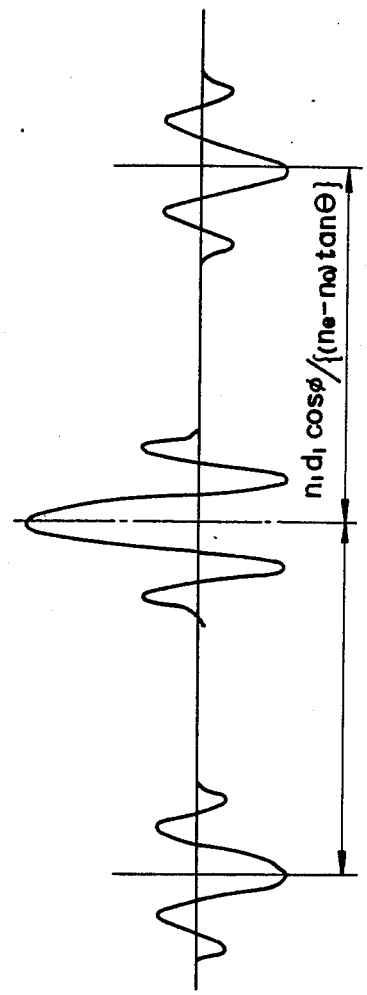
FIGS. 4A and 4B illustrate the practicability of accurate measurement of an air gap even in a case where a thin layer such as a photoresist layer exists on the object.
Figure 4B:
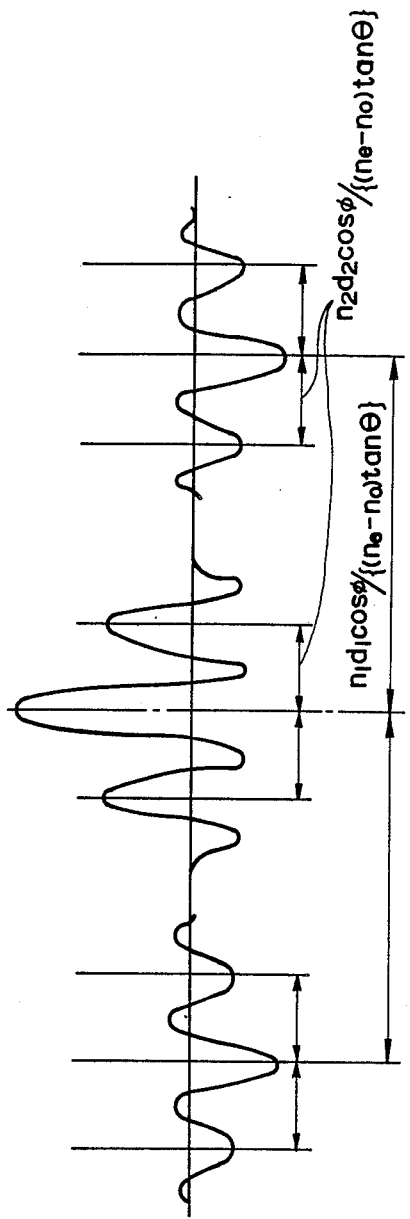
Figure 5:
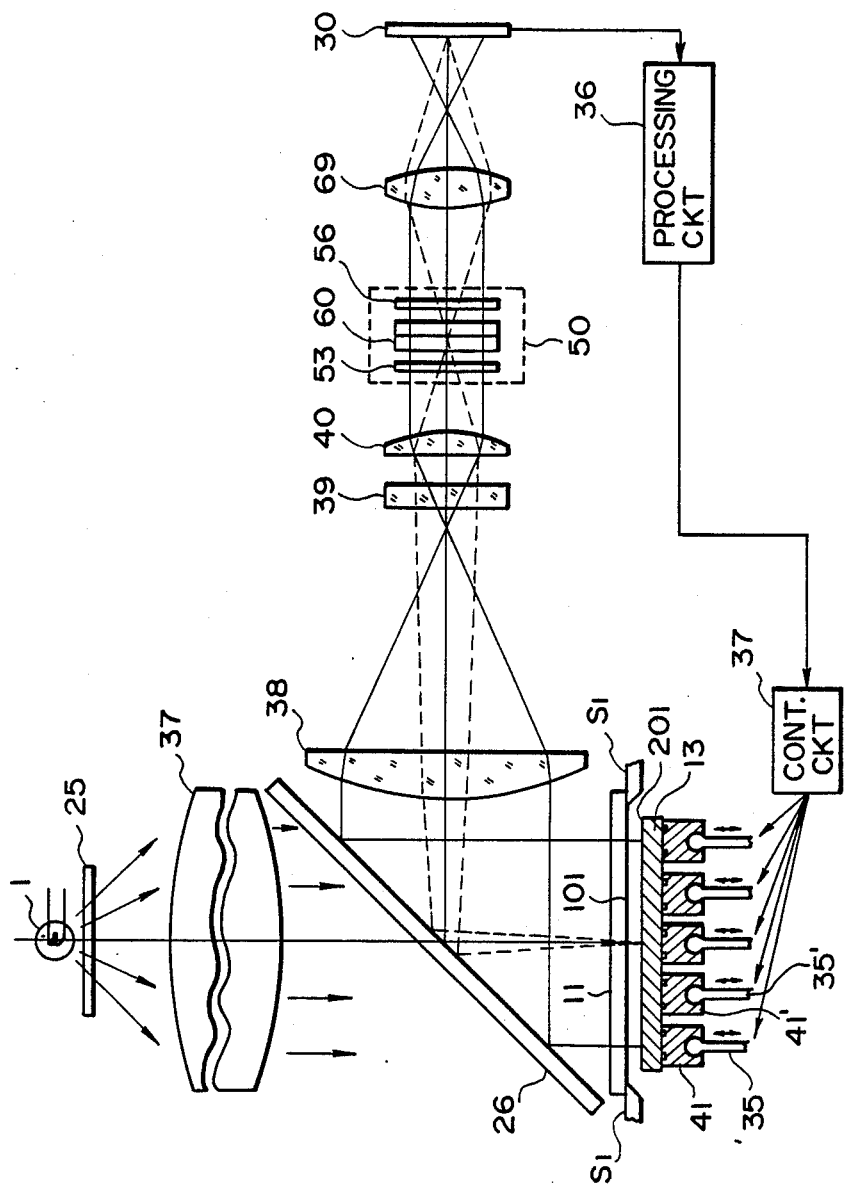
FIGS. 5 and 6 are views showing an arrangement of a first embodiment according to the present invention.
Figure 6:
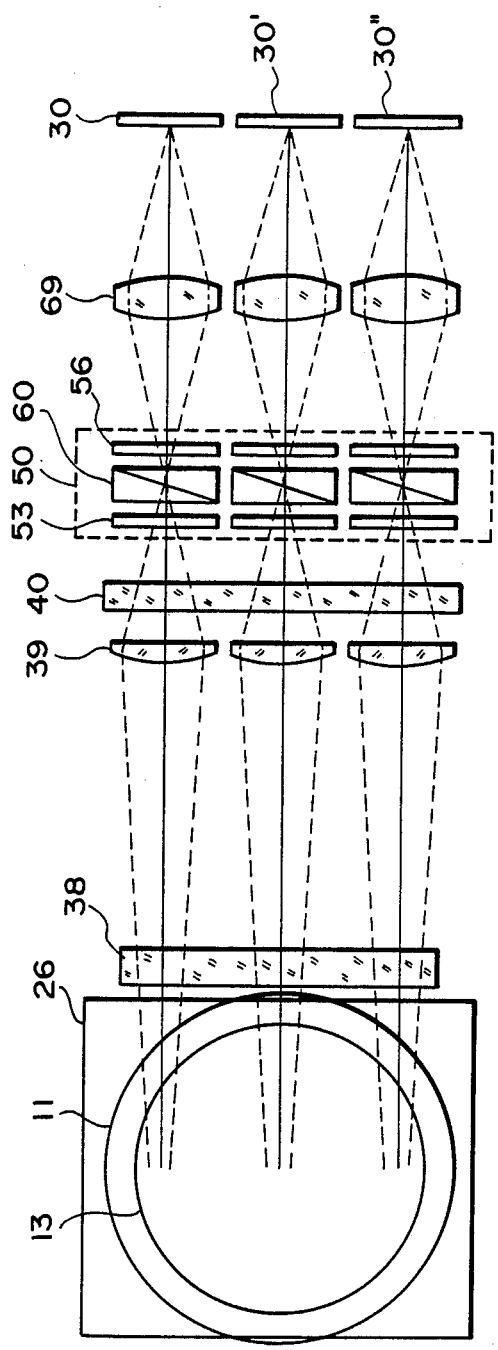

A gap measuring system according to a first embodiment of the present invention will now be described with reference to FIGS. 5 and 6. The gap measuring system of this embodiment is one which is incorporated into an exposure apparatus of proximity type. In FIGS. 5 and 6, elements having similar functions as of the corresponding elements shown in FIGS. 1–3 are denoted by the same reference numerals. The gap measuring system includes a white light source 1 such as a tungsten lamp. The light emitted from the light source 1 passes through a yellow filter 25 and then enters into a collimator lens 37 whereby it is collimated. The collimated light is then incident on a mask 11 and a wafer 13 perpendicularly. Since the lens 37 does not need to have a so strict performance, it may be replaced by an exposure lens of the exposure apparatus. The wafer 13 is held by a number of split vacuum suction holders 41, 41', etc. These holders 41, 41', etc. are connected to actuator rods 35, 35', etc. through spherical bearings, respectively.

The light beam emitted from the light source 1 and directed to the mask or wafer passes through a half mirror 26. A portion of the light beam incident on the mask 11 is reflected by a surface 101 of the mask 11. The remaining portion of the light beam is transmitted through the mask 11 and is reflected by a surface 201 of the wafer 13. The optical path length difference between these two light beams, that is the air gap between the mask and wafer is measured by a white light interferometer 50. Along the optical path from the mask and wafer to the interferometer, there are disposed cylindrical lenses 38 and 40 each having a generating line extending in the direction perpendicular to the plane of sheet of the drawing and another cylindrical lens 39 having a generating line contained in the plane of the sheet of the drawing. By means of the anamorphic optical function of these cylindrical lenses, an image of each of the mask 11 surface and wafer 13 surface are formed on a Wollaston prism 60 at different magnifications with respect to the longitudinal and lateral directions. More specifically, with respect to the lateral direction of slit-like measurement areas 102, 103 and 104 shown in FIG. 7 which will be described later in more detail, i.e. with respect to the direction orthogonal to the lengthwise direction of the areas 102, 103 and 104, the image is projected on the Wollaston prism 60 at an enlarged magnification in the minor direction of Wollaston prism 60, i.e. in the longitudinal direction of the Wollaston prism 60 as viewed in FIG. 6. On the other hand, with respect to the lengthwise or longitudinal direction of the areas 102, 103 and 104 shown in FIG. 7, the image is projected on the Wollaston prism 60 at a reduced magnification in the major direction of the Wollaston prism 60, i.e. in the direction which is perpendicular to the plane of the sheet of FIG. 6.

The interference fringe formed on the Wollaston prism 60 is imaged on a photodetector 30 through a relay lens 69. The photodetector may comprise an image pickup tube or a linear photodetector array such as a CCD or MOS device array. From a scanning signal corresponding to one scan line, the positions of the side peaks relative to the center peak, that is, the air gap between the mask and wafer is detected. In other words, from the scanning signals corresponding to different scanning lines, the air gaps at different measurement points on the mask 11 are detected.

The imaging optical system consisting of the cylindrical lenses 38 and 40 shown in FIG. 5 is a reduction optical system. Therefore, the values obtainable from different scanning lines correspond to the gaps at the points on the wafer or mask which are remote from each other.

Each scan signal obtained from the photo-detector 30 corresponding to each scan line is processed by a signal processing circuit 36 so that a value corresponding to the gap is obtained. This value is compared with a reference value, and, on the basis of the results of comparison, a control circuit 37 drives one or more of the actuator rods 35, 35', etc. As the result of such adjustment, the signals produced by the photodetector 30 corresponding to the respective scanning lines have waveforms each corresponding to the desired or standard air gap.

FIG. 6 shows the optical system of FIG. 5 as viewed in the direction rotated through 90 degrees with respect to the optical axis. As shown in FIG. 6, three gap measuring optical systems are juxtaposed with each other. It will be understood that the lateral imaging magnification is higher with respect to the direction in which the side peaks are generated in the Wollaston prism, i.e. in the plane of sheet of the drawing or in the longitudinal direction as viewed in this Figure.

A slit-like measurement area according to the present invention provides the following advantages.

FIG. 7 is a plan view of a wafer showing an example of patterns of the semiconductor devices. Usually, the semiconductor devices comprise rectangular patterns of the same dimension which are regularly arrayed in the lateral and longitudinal directions. In FIG. 7, orthogonal solid lines show the portions of the wafer which will be cut away by a dicing saw upon final cutting of the wafer. Usually, these portions are not subjected to specific semiconductor circuit manufacturing processes. When the slit-like measurement areas according to the present invention are located on the region 102, 103 and/or 104, gap measurement can be performed independently of the shape of the semiconductor device and irrespective of the stage of the manufacturing steps.

Figure 8:
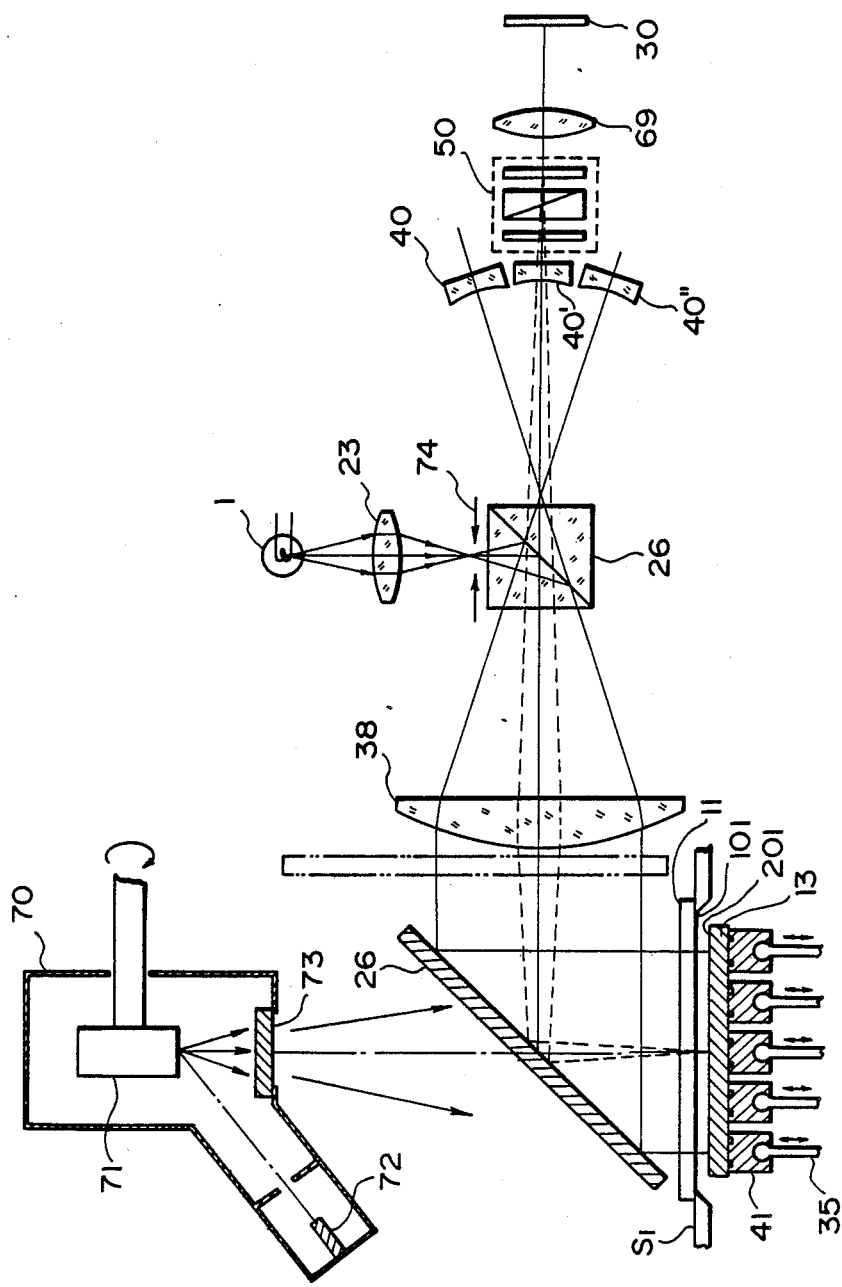
FIG. 8 is a view showing an optical arrangement of a second embodiment according to the present invention.

A gap measuring system according to a second embodiment of the present invention is shown in FIG. 8. The gap measuring system in this embodiment is incorporated into an X-ray exposure apparatus. In FIG. 8, elements having similar functions as corresponding elements in the foregoing embodiment are designated by the same reference numerals. In the drawing, a target 71 is contained in a vacuum container 70. An electron gun 72 supplies electron beams and, when these electron beams impinge on the target 71, the target 71 generates X-rays. The generated X-rays pass through a window covered by a beryllium film 73 and then pass through a mask 11 so that they are incident on a wafer 13 for exposure thereof. In the X-ray exposure, the wafer is exposed to the diverging rays (X-rays) while a predetermined gap is maintained between the mask and the wafer, as illustrated in FIG. 8. For this reason, the gap must be precisely maintained at a constant value. The necessary precision is of the order of 10±1 microns. If the gap is not maintained precisely, there would occur dimensional errors in the patterns on the wafer.

The light beam emitted from a white light source 1 is condensed by a condensing lens 23 and, after passing through an aperture of a pin-whole plate 74, it is reflected by a beam splitter 26. The reflected light beam enters into a collimating lens 38 whereby it is collimated. The collimated light beam is reflected by a reflecting mirror 26 so that it is incident perpendicularly on a mask 11 and a wafer 13. Each of the light beams reflected by the mask 11 and the wafer 13 goes back along its on-coming path and passes through a beam splitter 26. After passing through the beam splitter 26, the light beam is incident on cylindrical lenses 40, 40' and 40". Each of the cylindrical lenses has a function for enlarging, in one direction, the image formed by the lens 38. Strictly speaking, such arrangement involves a problem of astigmatism. Since, however, the spread of the light beam is small, a necessary and sufficient depth of focus is maintained.

The interference fringe formed on a Wollaston prism is imaged on a photodetector 30 through a lens 69 so that the gap is measured. During X-ray exposure, only the reflecting mirror 26 is moved out of the optical path. With the use of a signal processing circuit such as shown in FIG. 5, the gap is adjusted in a similar manner as in the foregoing embodiment.

A gap measuring system according to a third embodiment of the present invention will now be described with reference to FIG. 9. The system includes a white light source 301 such as a tungsten lamp. The light beam emitted from the light source 301 passes through a condensing lens 323 and a yellow filter 325, in this order, and then is reflected by a beam splitter 326. The reflected light beam enters into a relay lens 339 whereby it becomes a substantially parallel light. This illuminating light is reflected by a swingable reflecting mirror 334 so that it is deflected as a beam 307. The light beam 307 passes through a condensing lens 338 and is reflected by a reflecting mirror 326 so that it is condensed on a mask 311 and a wafer 313. With the rotation or swinging movement of the mirror 334, the advancing direction of the reflected beam varies, with time, such as represented by a beam 307' and a beam 307". Since the reflecting mirror 334 is disposed adjacent to the focal point of the condensing lens 338, the directions of advancement of the rays after transmission through the condensing lens 338 becomes substantially parallel to each other. Therefore, all the rays are incident substantially perpendicularly on the mask 311 and wafer 313 irrespective of the position of the reflecting mirror 334. Each of the light beams reflected by the surface 401 of the mask 311 and by the surface 501 of the wafer 313, having an optical path length difference relative to each other, moves back along the on-coming path and passes through a beam splitter 326 so that it is incident on an interference fringe forming portion 350. At this time, each of the imaging light beams are made into a substantially parallel beam at a position of the reflecting mirror 334. Therefore, any defocus would not occur irrespective of the swinging movement of the reflecting mirror 334, so that the mask surface and a Wollaston prism 360 of the fringe forming portion 350 are maintained in an imaging relation. The white light fringe formed on the Wollaston prism 360 is imaged on a one-dimensional or two-dimensional photo-detector 330 through a projection lens 369.

Figure 9:
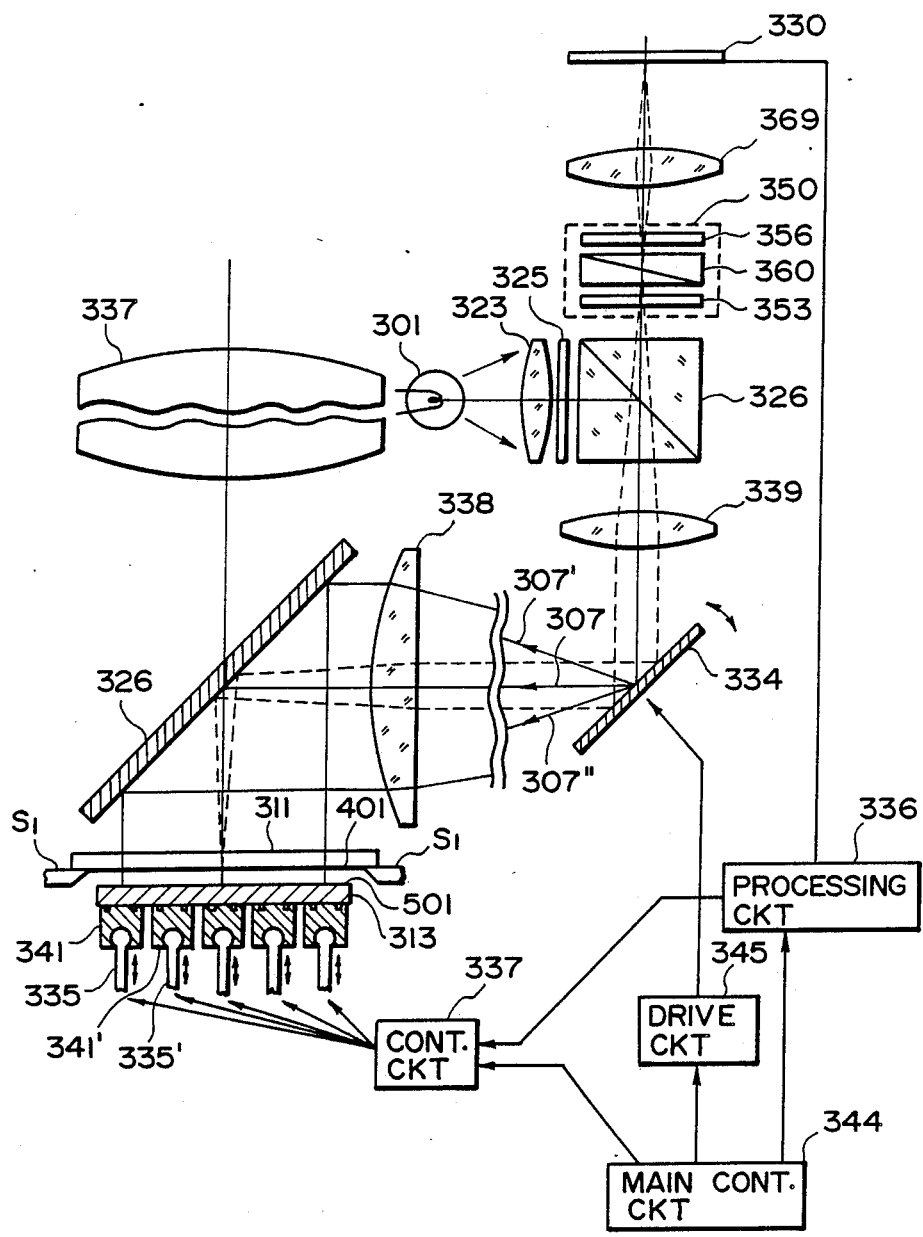
FIG. 9 is a view showing optical and electrical arrangements of a third embodiment according to the present invention.

The embodiment shown in FIG. 9 achieves accurate gap adjustment over a wider area. The principle of this will now be described.

When a particular point on the mask is designated by a main control circuit 344, the reflecting mirror 334 is driven or rotated in a predetermined direction by a reflecting mirror drive circuit 345. On the basis of the white light fringe caused at this time, the gap is calculated by a signal processing circuit 336 and the calculation result is compared with a reference value by this signal processing circuit 336. In accordance with the result of comparison, i.e. in accordance with the magnitude of the calculated value, an actuator control circuit 337 drives one or more of actuator rods 335, 335', etc. in the directions as denoted by double-headed arrows shown in FIG. 9.

The wafer 313 is held by vacuum suction on a wafer holder 341 which is divided into a plurality of holder elements 341, 341', etc. The wafer holding elements are connected to actuator rods 335, 335', etc., respectively, through spherical bearings.

As the most simple method of control, each of the air gaps at the points corresponding respectively to the mask holder elements 341, 341', etc. and an associated one of the actuator rods 335, 335', etc. are driven in the longitudinal directions as viewed in FIG. 9 to achieve a predetermined amount of gap. However, the present invention is not limited thereto, and any of other known control methods is available.

As possible alternatives, the reflecting mirror 334 may be replaced by a combination of two galvano mirrors, or by other means for deflecting the light beam such as a movable prism, a movable lens, an acousto-optic element, and the like. In the present invention, it is advantageous to supress the spread of the light in respect to the signal detection. This makes the depth of focus greater. As the result, the range of permissible defocus upon designing of an actual device becomes very wide.

A gap measuring system according to a fourth embodiment of the present invention will now be described with reference to FIG. 10. This embodiment is an example in which the system of the present invention is applied to an X-ray exposure apparatus. In this Figure, elements having similar functions as the corresponding elements of the FIG. 9 embodiment are designated by the same reference numerals. As shown in this Figure, a target 371 is contained in a vacuum container 370. An electron gun 372 generates electron beams and, when these electron beams impinge on the target 71, the target 71 generates X-rays. The generated X-rays pass through a window which is covered by a beryllium film 373. The X-rays are then transmitted through a mask 311 and are incident on a wafer 313 for exposure thereof. In the X-ray exposure, the wafer is exposed to the diverging rays (X-rays) while a predetermined gap is maintained between the mask and wafer. Therefore, a constant gap must be precisely maintained between the mask and wafer. The necessary precision is of the order of 10±1 microns. If the gap is not precisely maintained, there would occur dimensional errors in the patterns of the wafer.

The gap measuring system of this embodiment includes a white light source 301. The light beam emitted from the light source 301 passes through a lens 325 and, after being reflected by a beam splitter 326, it passes through cylindrical lenses 342 and 343. Thereafter, the light beam is incident on a galvano mirror 334 which is rotatable about a rotational axis extending perpendicularly to the plane of the sheet of drawing. The light beam reflected by this galvano mirror 334 is condensed by a condensing lens 338 and is then incident on the mask 311 and wafer 313 substantially perpendicularly. In the present embodiment, the cylindrical lenses 342 and 343 have different focal lengths. As the result, a light beam having a circular cross-section is transformed by the cylindrical lenses into a light beam having a slit-like cross-section on the wafer 311.

Each of the light beams reflected by the surface 401 of the mask and by the surface 501 of the wafer moves back along its on-coming path and enters into a Wollaston prism 360 in the form of an isotropic beam. The white light fringe formed on the Wollaston prism is imaged on a two-dimensional photodetector array or an image pickup tube 330 through a projection lens 369. From different scanning lines, measurement values for the gaps at different positions are obtainable.

The positional relation of the slit-like measurement areas, such as shown in FIG. 7, according to the present invention is as follows.

Figure 10:
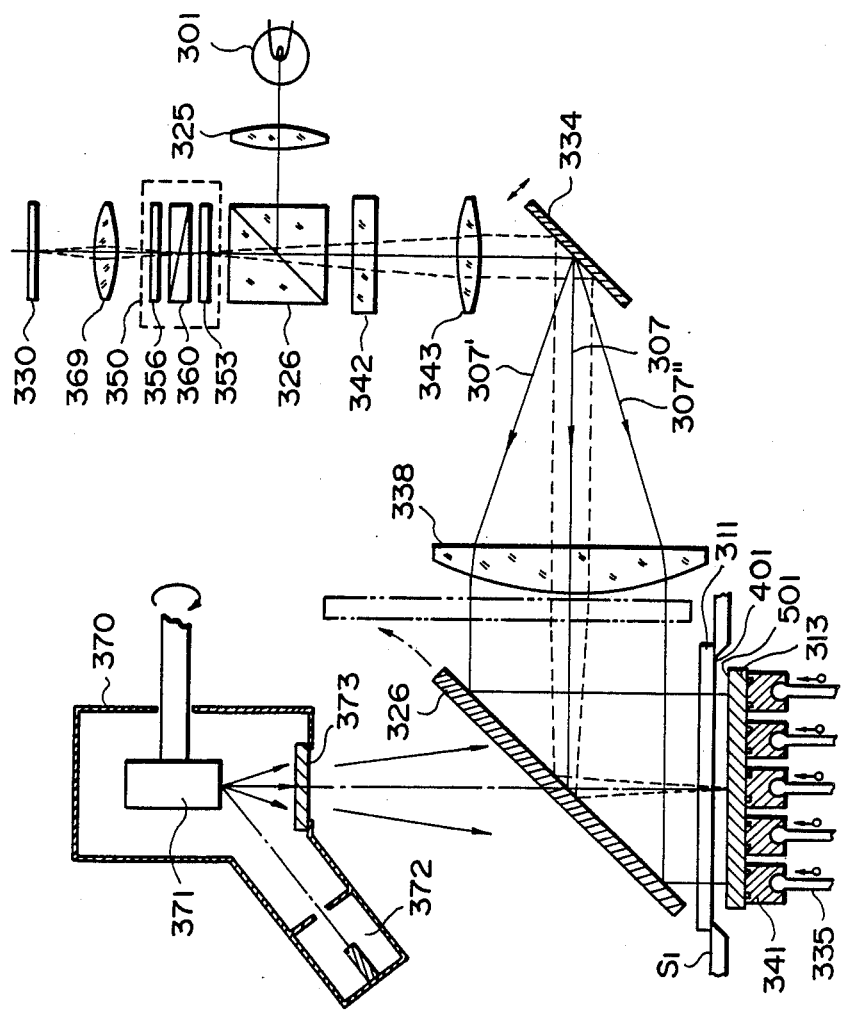
FIG. 10 is a view showing an optical arrangement of a fourth embodiment according to the present invention.

When the galvano mirror 334 is in the position shown in FIG. 10, the measurement area on the wafer is located on the slit region 103 shown in FIG. 7. When, on the other hand, the galvano mirror rotates so that the direction of advancement of the reflected beam varies with time such as designated by a light beam 307' and a light beam 307'', the measurement area on the wafer is displaced with time to be coinside with the slit region 103' or 103''. It is desired that the shape of the slit region on which the measurement area is to be located is linear in order that the measurement positions are coincident with the regions which are used for the purpose of scribing of the wafer. In order to assure this, the lens 338 is preferably an ordinary F-tan$\theta$ lens. Any specific lens system is not necessary.

In accordance with the present invention as has hitherto been described, the gap between the wafer and the mask can be maintained at a constant value at every stage of the semiconductor device manufacturing processes. Further, the gaps at multiple points can be adjusted with the use of a single gap measuring system. This is very advantageous.

The white light interferometer used in the present invention is not limited to the Wollaston prism described in the Specification. It will be easily understood that the white light interferometer may be provided by any of Rochon prism, Senarmont prism, and Michelson interferometer if one of the mirrors thereof is inclined and fixed.

While, in the foregoing embodiment, the anamorphic optical system has been described as being one having an image enlarging function with respect to the direction in which the Wollaston prism divides the wavefront and inclines the divided wavefronts, i.e. with respect to the longitudinal directions as viewed in FIG. 6, and having an image reducing function with respect to the direction orthogonal to the first-mentioned direction, it may have a unit magnification with respect to the longitudinal directions as viewed in FIG. 6 and an image reducing function with respect to the direction orthogonal thereto. Moreover, the anamorphic optical system may have a lower reduction ratio with respect to the longitudinal direction and a higher reduction ratio with respect to the direction orthogonal thereto.

While the invention has been described with reference to the structures disclosed herein, it is not confined to the details set forth and this disclosure is intended to cover such modifications or changes as may come within the scope of the following claims.

What is claimed is:

1. A gap measuring apparatus for measuring a gap between plural surfaces comprising:
   an illumination system for illuminating the surfaces with a light having different wavelength components;
   a wavefront dividing optical system for dividing wavefronts of the light reflected from the surfaces and for providing relative inclination between the divided wavefronts to produce elongated interference fringes;

a measuring region defining optical system disposed between said wavefront dividing optical system and the surfaces, for receiving the light reflected from the surfaces and directing the received light to said wavefront dividing optical system, said measuring region defining optical system being effective to define a slit-like measuring region on each of the surfaces and to form an image of each slit-like measuring region at a predetermined location with respect to said wavefront dividing optical system, each slit-like measuring region having a lengthwise direction corresponding to the lengthwise direction of the interference fringes;

wherein said wavefront dividing optical system receives the light from said measuring region defining optical system, and produces the elongated interference fringes by use of the received light; and wherein the image of each slit-like measuring region is formed by said measuring region defining optical system upon said predetermined location in a reduced magnification with respect to the lengthwise direction of the interference fringes but in an enlarged magnification with respect to a direction perpendicular to the lengthwise direction of the interference fringes; and means for detecting the gap between the surfaces on the basis of the interference fringes formed by said wavefront dividing optical system by use of the light from said measuring region defining optical system.

2. A gap measuring apparatus according to claim 1, wherein said measuring region optical system includes an anamorphic optical system.

* * * * *

UNITED STATES PATENT AND TRADEMARK OFFICE
CERTIFICATE OF CORRECTION

PATENT NO. : 4,932,781
DATED : June 12, 1990
INVENTOR(S) : TETSURO KUWAYAMA

Page 1 of 2

It is certified that error appears in the above-identified patent and that said Letters Patent is hereby corrected as shown below:

Title Page:

AT [56] REFERENCES CITED

U.S. Patent Documents, "2,595,923 8/1961 Ubbelohde et al. ..... 356/357" should read --2,995,923 Ubbelohde et al. ..... 356/357--.

COLUMN 2

Line 47, "extra-ordinary" should read --extraordinary--.

COLUMN 3

Line 2, "Wollaston prism P." should read --Wollaston prism 60.--
Line 11, "designates" should read --designate--.
Line 43, "transmitted" should read --being transmitted--.

COLUMN 4

Line 5, "double headed" should read --double-headed--.
Line 22, "The" should be deleted.

COLUMN 7

Line 61, "pin-whole plate 74," should read --pinhole plate 74,--.
Line 68, "on-coming" should read --oncoming--.

COLUMN 8

Line 36, "becomes" should read --become--.
Line 43, "on-coming" should read --oncoming--.

UNITED STATES PATENT AND TRADEMARK OFFICE
CERTIFICATE OF CORRECTION

PATENT NO. : 4,932,781

DATED : June 12, 1990

INVENTOR(S) : TETSURO KUWAYAMA

Page 2 of 2

It is certified that error appears in the above-identified patent and that said Letters Patent is hereby corrected as shown below:

COLUMN 9

```
Line 37, "target 71," should read --target 371--,--.
Line 38, "target 71" should read --target 371--.
Line 68, "on-coming" should read --oncoming--.
```

COLUMN 10

```
Line 17, "to be coinside" should read
         --to be coincident--.
```

Signed and Sealed this

Third Day of November, 1992

Attest:

DOUGLAS B. COMER

*Attesting Officer*    *Acting Commissioner of Patents and Trademarks*